(12) United States Patent
Hollmer

(10) Patent No.: US 6,418,054 B1
(45) Date of Patent: Jul. 9, 2002

(54) EMBEDDED METHODOLOGY TO PROGRAM/ERASE REFERENCE CELLS USED IN SENSING FLASH CELLS

(75) Inventor: Shane C. Hollmer, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/387,421

(22) Filed: Aug. 31, 1999

(51) Int. Cl.$^7$ .............................................. G11C 16/04
(52) U.S. Cl. ............................. 365/185.2; 365/185.24; 365/210
(58) Field of Search .......................... 365/185.2, 185.22, 365/185.03, 185.24, 185.33, 210

(56) References Cited

U.S. PATENT DOCUMENTS 5,163,021 A * 11/1992 Mehrotra et al. ........... 365/185

* cited by examiner

Primary Examiner—Vu A. Le
(74) Attorney, Agent, or Firm—Fliesler, Dubb, Meyer & Lovejoy

(57) ABSTRACT

Programming lines are attached to reference cells of a memory device. A state machine controls voltages and/or currents applied to the reference cells via the programming lines to program and verify a program state of the reference cells. The state machine utilizes existing array cell programming operations conducted by the programming lines to the reference cells. The utilization of internal circuitry of the memory device in the programming of reference cells reduces the sort and test time of the memory device. The memory device may be a flash memory device or any device having reference cells, and the reference cells may be of any configuration or structure, including nitride layer cells.

41 Claims, 11 Drawing Sheets

———————————————— 2.5v Program Verify

------------------------------ 2v Read Verify

———————————————— 1.5v Erase Verify

EMBEDDED METHODOLOGY TO PROGRAM/ERASE REFERENCE CELLS USED IN SENSING FLASH CELLS

BACKGROUND OF THE INVENTION

1. Field of the Invention

The present invention relates in general to a scheme and methodology for programming and erasing reference cells in Flash memory devices. The invention is more particularly related to a scheme that utilizes existing flash memory circuitry for the programming of reference cells to attain a threshold voltage appropriate for reference verification of array cell read, program, and erase operations. The invention is also particularly related to a method for performing the programming of reference cells utilizing gate voltages and comparisons of array cell and reference cell voltages and currents.

2. Description of the Related Art

A typical flash memory device 100 is illustrated in FIG. 1. The flash memory device includes an array of flash cells (array cells or array) 110, an embedded state machine 120, a reference array 130, and sensing circuits 140. The embedded state machine controls the flash memory device 100, including operations such as addressing (activation of word lines and bit lines) for reading, programming, or erasing flash memory cells, and applying appropriate voltages to the array cells being programmed. Flash memory devices typically include arrays having 1 Mbit to 64 Mbit or more flash cells.

The flash cells themselves are generally known, and the term "flash" refers to EEPROMs having data written to them, or programmed, by a process known as a hot electron injection, and being erased by Fowler-Nordheim (FN) tunneling. The operation and structure of such devices is discussed in IEEE Journal of Solid State Circuitry, Vol. SC-22, No. 5, October, 1987, pages 676–683, in an article entitled, "A 128K Flash EEPROM Using Double Polysilicon Technology", by Gheorghe Samachisa, et al.

Flash EEPROM memory cells are generally formed on a semiconductor substrate having diffused therein a N+ drain region and the double diffused source region. A tunnel oxide is formed on the silicon substrate separating a floating gate from the source and drain regions, and a control gate is separated from the floating gate by another insulating layer. The source regions of individual memory cells (for one row of an array, for example) may be connected together and behave as one electrical terminal, or in other arrangements depending on the configuration of the cells.

According to conventional operation, flash EEPROM memory cells are programmed by inducing hot electron injection of electrons from the channel region near the drain to the floating gate (voltages are applied to the gate and drain, and the source is grounded, causing electrons to migrate to the floating gate). Electron injection will carry a negative charge onto the floating gate of a programmed cell. Erasing of flash EEPROM memory cells is typically carried out by Fowler-Nordheim tunneling between the floating gate and the source (known as source erase or negative gate erase) or between the floating gate and the substrate (known as channel erase).

Either programming or erasing of flash cells result in a non-volatile $V_T$ of the associated programmed or erased cell. A typical flash cell is illustrated in FIG. 2. The flash cell 200 is a floating gate transistor, the floating gate 210 having either a programmed, erased, or natural $V_T$ threshold. $V_{GS}$ is the voltage applied between the gate and the source, and $I_{DS}$ is the current (if any) flowing from the drain (240) to source (230).

The embedded state machine 120 utilizes reference cells in the reference array 130 to provide reference voltages for the flash memory operations (reading, programming, erasing, and verifying, for example). A state of a selected array cell is compared to the state of a reference array specifically programmed for the operation being performed.

To determine whether or not a specific cell(s) in array 100 has/have been programmed or erased properly, or to read any specific cell(s) in the array, cells in the reference array are utilized to compare the $V_T$ of the specific cell(s). Sensing circuits 140 are provided for performing a comparison between individual cells of the array 110 and the reference array 130. The basic process is illustrated in FIG. 3, where a selected line 310 (from a selected array cell) from array 110 and a selected line 320 (from a selected reference cell having a $V_T$ programmed for the operation being performed) from reference array 130 are provided to a comparator 300 of sensing circuit 140. Again, the selection of specific array cells and reference cells for comparison is generally under the control of the state machine 120.

One possible configuration of electronics for reading a row of flash cells in the array 110 is illustrated in FIG. 4. A word address 405 is input from state machine 120 to a word select 400 that provides a $V_{SEL}$ to each of a referenced cell 410 (part of reference array 130), and flash cells 420-1 . . . 420-(n−1) (part of array 110). A comparison circuit 430 then compares the current flow of each flash cell 420-1 . . . 420-(n−1) against the current flow of reference cell 410.

The reference cell 410 is typically one of a set of reference cells maintained in the reference of array 130. Each reference is generally utilized for comparison of one specific operation (or mode of operation) for the entire array.

During manufacture of the flash cell devices, the reference cells are programmed to have a $V_T$ appropriate for the comparison function to be performed. This programming of reference cells is commonly performed during a test time of the flash device after fabrication.

It is important that reference cells are programmed to precise $V_T$ levels to assure accurate and reliable operation of flash memory devices. The manufacturing environment is well suited to perform such programming because accurate voltages and controlled conditions are available to assure that the $V_T$ of each reference cell is programmed at a precise level. The programming of reference cells can be done utilizing any of the above described techniques (hot electron injection, and/or Fowler-Nordheim tunneling, for example).

However, the processes of programming the reference cells are cumbersome and time-consuming. Currently, a tester controls the sequence externally, inputting a voltage and measuring a current after any number of programming pulses intended to bring the reference cell being programmed to a desired threshold ($V_T$). The procedure is time intensive and a large percentage of total sort time is dedicated to reference cell programming.

SUMMARY OF THE INVENTION

The present inventor has realized the need to reduce test and sort time associated with the programming of reference cells. The present invention provides a scheme whereby cells (from flash memory or other semiconductor devices) may be programmed utilizing internal circuitry to perform the programming at accurate levels and a reduction of test time.

The present invention utilizes existing state machine logic, existing word, bit, and reference lines, and existing sensing circuitry to program reference cells to a desired threshold value ($V_T$). The present invention provides programming lines to the reference cells so that the $V_T$'s of the reference cells may be altered via the same methodologies utilized to program array cells. Typical flash memory devices already have array cell/reference cell sensing mechanisms in place and these are then utilized to sense the programmed state of the reference cells.

The present invention provides various methods for sensing whether the flash cells have been programmed to the desired threshold ($V_T$), including a comparison of currents using a $V_{GS}$ method, and a direct measurement of $V_T$ via measurement of a $V_{GS}$ that allows a programmed reference to conduct a small current source.

The present invention includes programming the reference cells to a $V_T$ within a specified margin of their natural $V_T$ level. The present invention performs this by utilizing the $\Delta_{GS}$ method for programming the reference cells along with an array cell as a reference for programming the reference cells.

The present invention utilizes any one of voltage pumps present on the semiconductor device, or external voltage sources to provide highly accurate voltages to assure the programming of reference cells is performed within appropriate tolerances. The voltages may be applied externally during the programming process, or a table register value may be input to the device which then divides a reference voltage to an appropriate level for programming.

The present invention includes a method for performing the reference cell programming to assure that the $V_T$ of each reference cell is within predetermined limits.

The present invention is embodied in any of: a memory device comprising, internal circuitry configured to program reference cells within the memory device; a memory device comprising reference cell programming lines connected to at least one terminal of at least one reference cell, and a control mechanism connected to said reference cell programming lines; a device comprising, a set of reference cells, and at least one voltage pump coupled to said reference cells and configured to supply at least one voltage to a least one of said reference cells in a programming process performed on said at least one reference cell; and a memory device comprising, at least one array cell configured to store data, at least one reference cell configured to provide a reference for operations performed on said array cell, means for performing said operations on said array cells utilizing said reference cells, and means for programming said reference cells utilizing internal circuitry of said memory device.

The present invention is also embodied in any of: a method of programming a reference cell in a device, comprising the step of programming a threshold voltage of said reference cell utilizing internal circuitry of the device; and a computer readable media having instructions stored thereon that, when loaded into a computer, cause the computer to perform the step of programming a threshold voltage of said reference cell utilizing internal circuitry of the device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
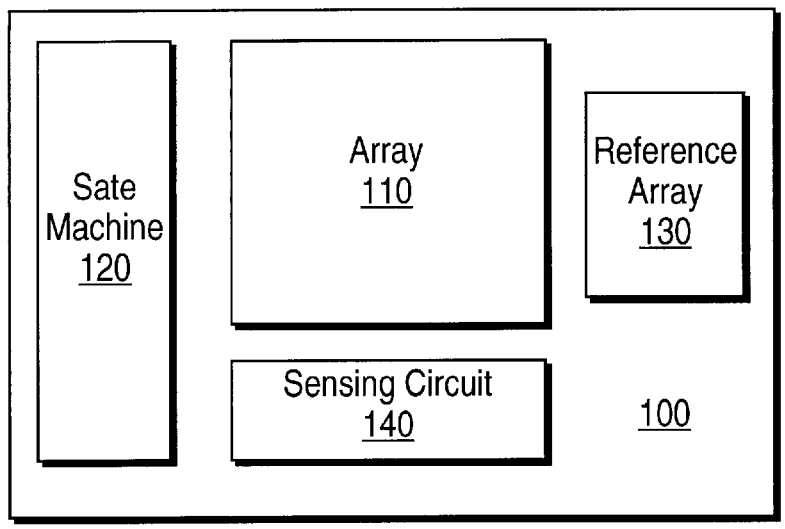
FIG. 1 is a layout of a conventional flash memory device.
Figure 2:
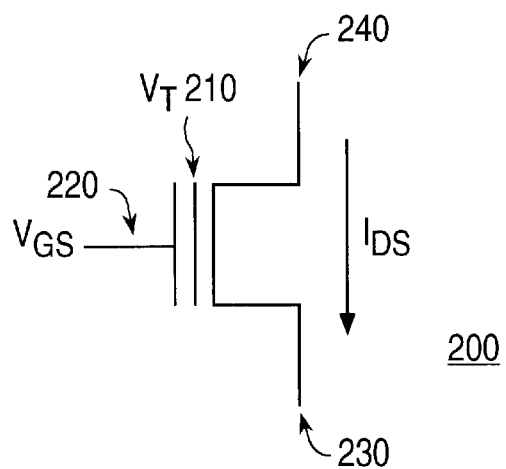
FIG. 2 is an illustration of a conventional flash memory cell constructed from a floating gate transistor.
Figure 3:
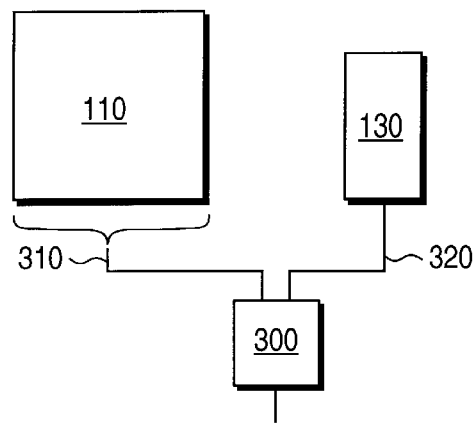
FIG. 3 is a block diagram of circuitry for comparison of an array cell and a reference cell.
Figure 4:
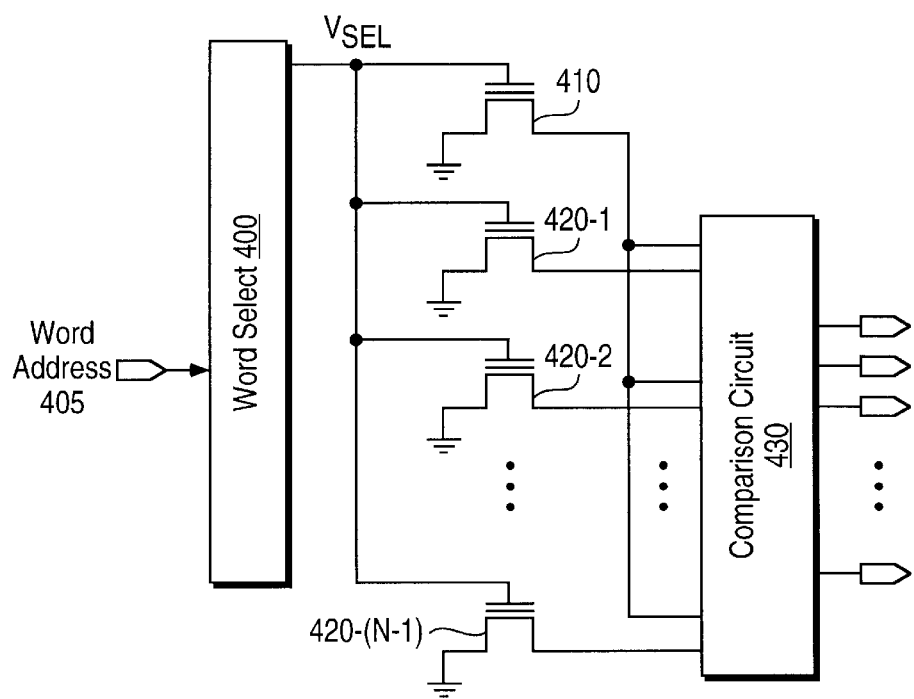
FIG. 4 is an illustration of a row from a convention flash memory cell array and a reference cell being compared.
Figure 5:
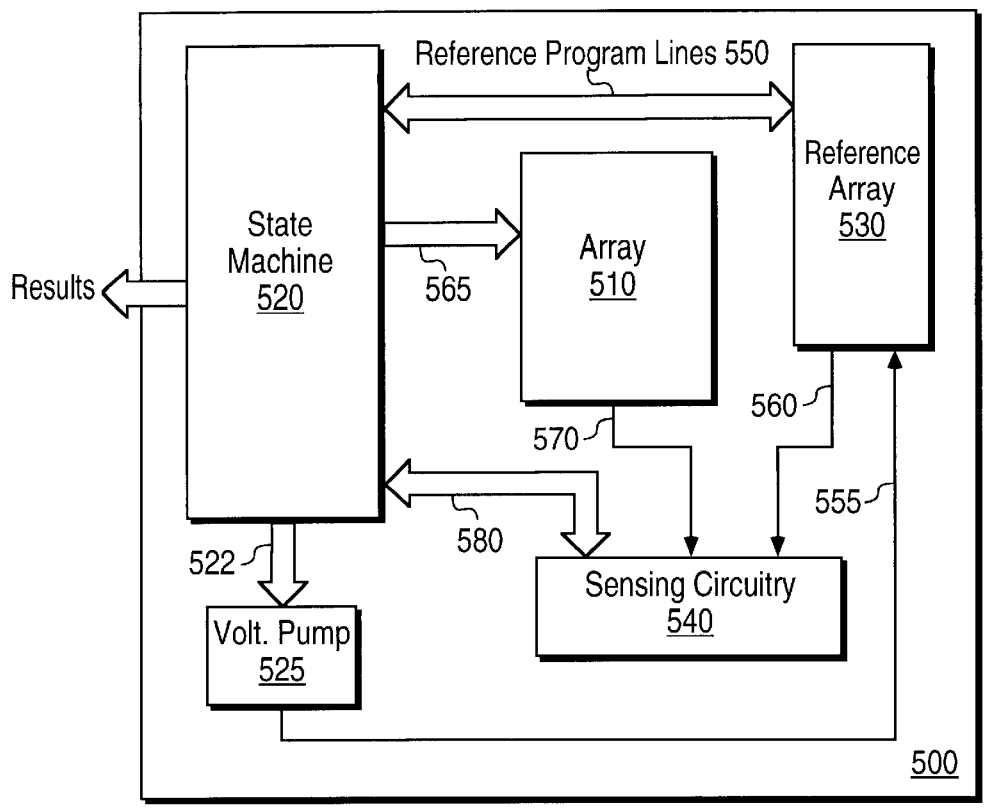
FIG. 5 is a layout of a flash memory device according to one embodiment of the present invention.

The present invention performs programming of reference cells using circuitry internal to a flash memory device. Referring again to the drawings, wherein like reference numerals designate identical or corresponding parts throughout the several views, and more particularly to FIG. 5 thereof, there is illustrated a layout of a flash memory device (flash device) 500 according to the present invention. The flash memory device includes, a state machine 520, array 510, reference array 530, sensing circuitry 540, and reference programming lines 550.

Programming of reference cells, as described herein, includes steps for applying programming pulses to alter at $V_T$ threshold of the reference cells, and steps for verifying the programmed level of the reference cells. In the present invention, an internal state machine (state machine 520, for example) controls the entire program/program verify process.

In flash device 500, the reference programming lines 550 are configured to allow the state machine 520 to perform programming of reference cells in the reference array 530. The flash device 500 reuses existing comparison lines 560 and 570 to perform comparisons of voltages and/or currents between cells of the flash array 510 and reference array 530.

The reference cells may be programmed to a range of threshold voltages ($V_T$). One method of programming the reference cells is to provide a golden reference that is preprogrammed (at test time) to a precise threshold voltage. The golden reference is described in U.S. Pat. No. 5,828, 601, by Hollmer, et al., entitled "Programmed Reference," which is incorporated herein by reference.

Figure 6:
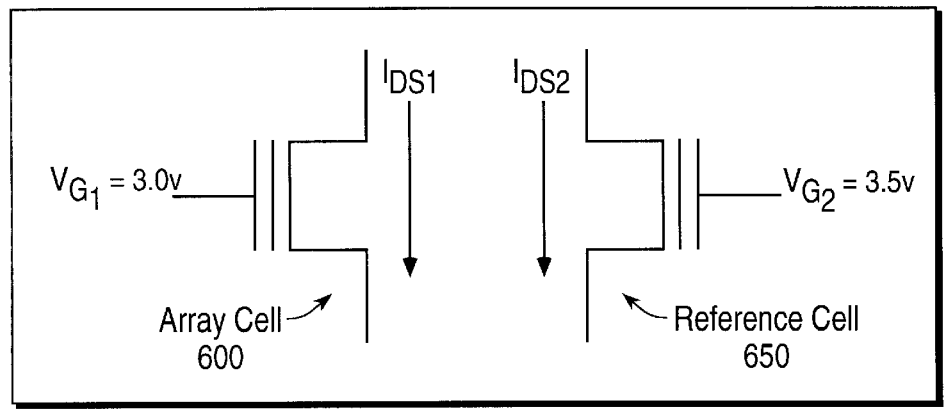
FIG. 6 is an illustration of an array cell used as a reference cell to determine a $V_T$ level of a reference cell according to the present invention.

The present inventor has determined new ways to accurately program the reference cells. In one embodiment, a flash cell in flash array 510 is selected as a reference cell before programming the cells in the reference array 530. FIG. 6 illustrates an array cell 600 (a floating gate transistor in this example, other types of cells are possible), and a reference cell 650. The method of programming the reference cell utilizes the MOS transistor saturation equation $I_{DS}=K(V_{GS}-V_T)^2$, which illustrates the relationship between the threshold voltage (programmed level in most cases) and gate voltage applied to a flash cell, to verify the programmed level of the flash cell.

Utilizing the MOS transistor saturation equation and setting currents equal, find the relationship $(V_{g1}-V_t)^2=(V_{g2}-V_t)^2$. Therefore, by applying accurate voltages $V_{g1}$ and $V_{g2}$, reference cell 650 may be accurately compared to the $V_T$ of an array cell.

Thus, in the example of FIG. 6, a $V_{g1}$ of 3 volts is applied to the gate of array cell 600 and a $V_{g2}$ of 3.5 volts is applied to the gate of reference cell 650. In this case, if one of $V_{g1}$ and $V_{g2}$ have been adjusted such that $I_{DS1}$ and $I_{DS2}$ are equivalent, it means that the $V_T$ threshold of the reference cell 650 is 0.5 higher than that of the array cell. If this is not a desired threshold level for the reference cell 650, the reference cell is reprogrammed in a manner to obtain the desired threshold level and then retested.

Figures 7, 8:
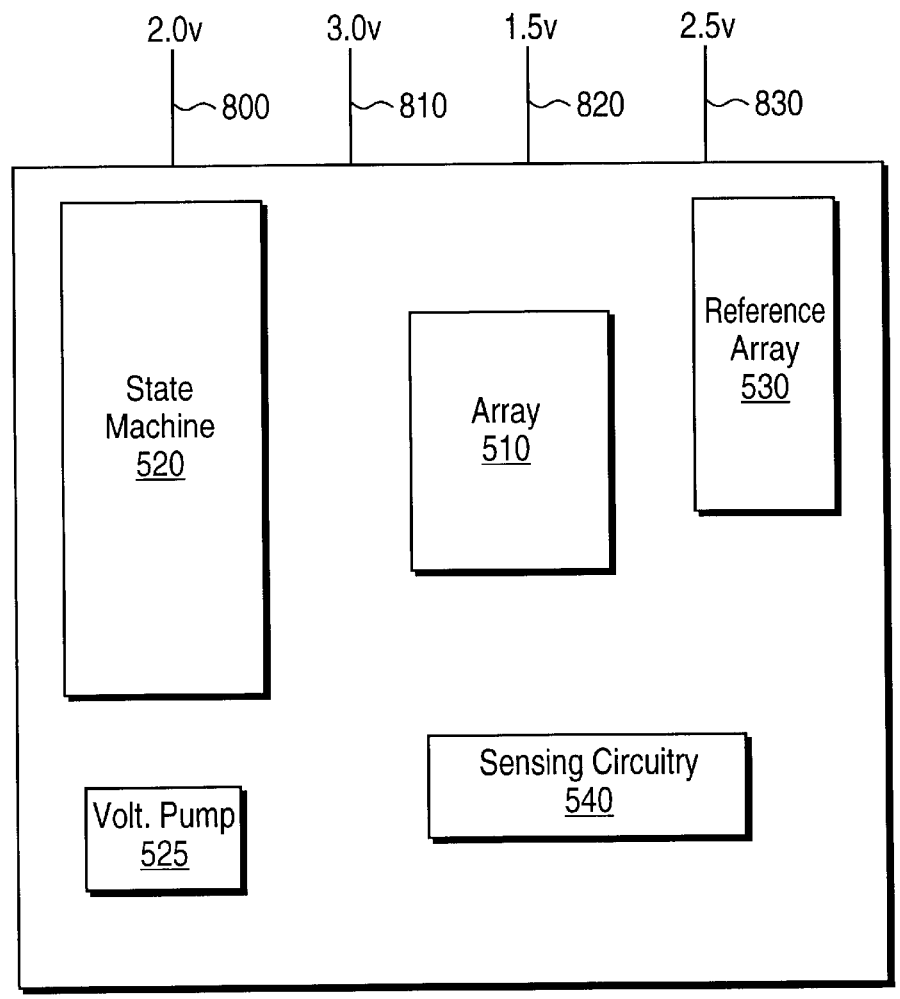
FIG. 7 is a graph of voltage reference levels utilized in a flash memory cell.
FIG. 8 is an illustration of a flash memory device having plural reference voltages input for programming reference cells according to the present invention.

The present inventor has found it advantageous to program the program and erase levels of the reference cells to plus or minus a specific delta of a $V_T$ that is a natural threshold of the array cells. FIG. 7 is a graph of program verify, erase verify, and read verify voltage levels that are in within a 0.5 delta of a natural threshold of $V_T=2V$. The natural threshold $V_T$ is then utilized as a desired read threshold for those array cells. Other configurations having a different specific delta level are clearly possible, for example, a 1V delta may also be utilized.

The MOS transistor saturation equation may be utilized to compare gate voltages and currents of an array cell and a reference cell (this comparison performed during verify steps of a reference cell programming process). Performing these comparisons at test time allows accurate voltages to be applied in a controlled environment. It may not be practical to apply the accurate voltages to the reference and array cell gates during normal read operations because it is difficult to come up with those voltages outside of the test environment. However, accurate voltages can be produced during test time because there is comparatively more time during tests (i.e., it is not necessary to provide 15 nanosecond or other cycle times of relatively high speed), and the process may utilize microseconds (an unacceptable delay in actual operations), voltage pumps or a divide operation off of an external voltage source to provide the accurate the voltages. Thus, the program level of the reference cells can be produced very accurately during test time.

One embodiment for supplying the accurate voltages in the verify steps of the reference cell programming process is to bring direct lines from outside test sources into the flash memory device. FIG. 8 illustrates external voltages of 2.0 v, 3.0 v, 1.5 v, and 2.5 v (lines 800–830) brought onto a device and may be utilized in verifying programmed levels of reference cells, for example. Other accurate voltages may also be supplied in a similar manner. For example, higher voltages (10 v, 15 v, for example) to perform actual programming of the reference cell (tunneling operations for example, not verification). Once the voltages are brought onto the flash memory device, the state machine 520 or other electronics would then apply the required voltages from the outside sources to the gates of the array cell and reference cell being tested (and/or source or drain depending on the operation being performed, programming, for example).

Figure 9:
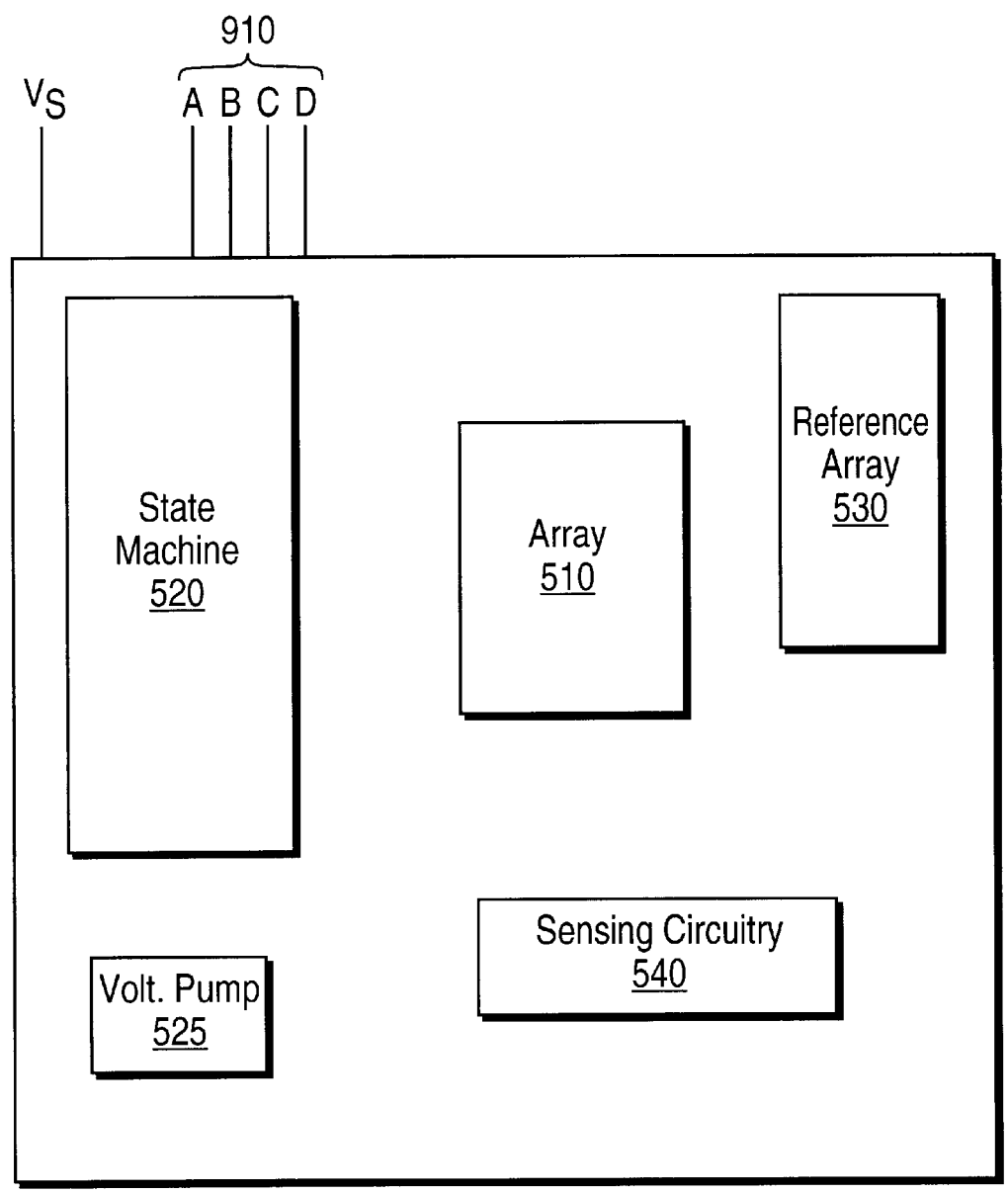
FIG. 9 is an illustration of a flash memory device inputting a table register value that identifies a reference voltage for programming reference cells according to the present invention.

In another embodiment, a table register input may be provided as illustrated in FIG. 9 (see 910, for example). The state machine 520 receives the table register input and determines the desired voltage levels from a table or other identification mechanism. An example table register is provided in Table 1.

TABLE 1

| Table Register | |
|---|---|
| TR Input A B C D | Voltage |
| 0 0 0 0 | 1.5 |
| 0 0 0 1 | 1.6 |
| 0 0 1 0 | 1.7 |
| 0 0 1 1 | 1.8 |
| 0 1 0 0 | 1.9 |
| . . . . | . |
| . . . . | . |
| . . . . | . |
| . . . . | n |

The desired voltages would then be routed from an external source (lines 800–830, for example), or divided from a source voltage ($V_S$, for example), or otherwise generated and provided to the corresponding array cell and reference cell and then utilized by the operation being performed.

Figure 10:
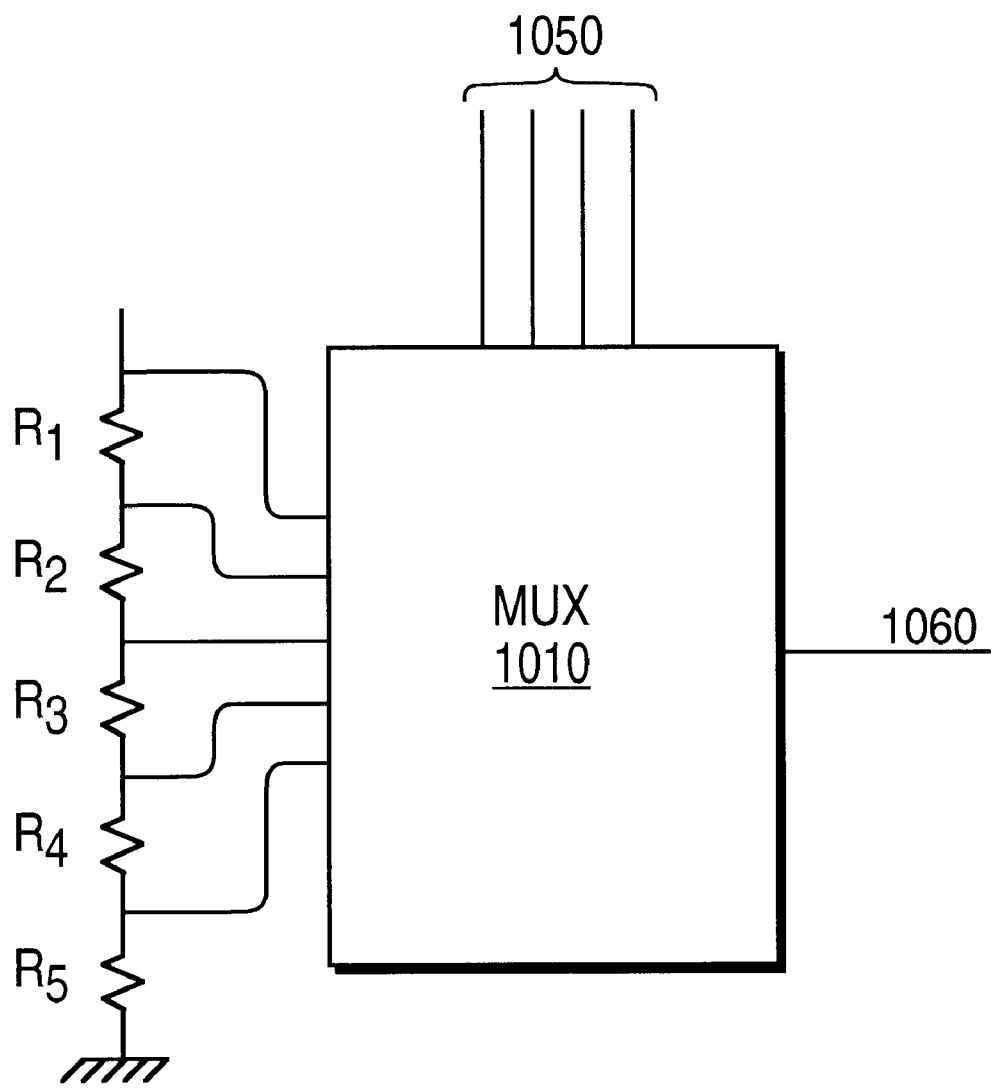
FIG. 10 illustrates a resistor divider for providing voltages according to a table register input.

In one embodiment, the state machine 520 sends control signals 1050 to a MUX 1010, as illustrated in FIG. 10. To provide an accurate voltage from a voltage divider consisting of a series of resistors having predetermined values (R1 . . . R5). The MUX 1010 output, 1060, would then be directed to the appropriate gate of either an array or reference cell. The $V_S$ for applying voltage to the voltage divider can be supplied from an accurate external source as illustrated in FIG. 9, or alternatively, may be produced by an internal voltage pump.

One problem with utilizing outside sources for accurate voltages is that the voltages need settling time and additional apparatus or test time to control voltages being applied in the program and verification operations of the reference cell programming process. Outside sources are slow because those voltages (high programming voltages, for example) are applied programming voltages, for example) are applied externally, and it takes time to ramp those voltages up and down during the reference cell programming process.

However, in several embodiments, the present invention uses external voltages that do not need to be changed (externally). For example, the programming of the state machine may simply utilize a single fixed voltage. ($V_S$, for example), which supplies an on chip voltage pump to produce the various program and verification voltage level required by the reference cell programming process and then performs the programming process on the reference cells and reports the result to the outside world (which would be displayed to a tester or fed to a testing mechanism for tabulating programming results, for example).

Referring again to FIG. 5, an on chip voltage pump 525 is illustrated. The on chip voltage pump 525 is controlled by the state machine 520 via control lines 522. Voltages output from the on chip voltage pump are applied to the reference cells 530 via application lines 555. Control lines 550 may also provide direction as to which terminals or gates of the reference cells the pump voltages are applied. The on chip pump 525 may have multiple stages or comprise plural individual pumps for providing different voltage levels required in the reference cell programming process.

Figure 11:
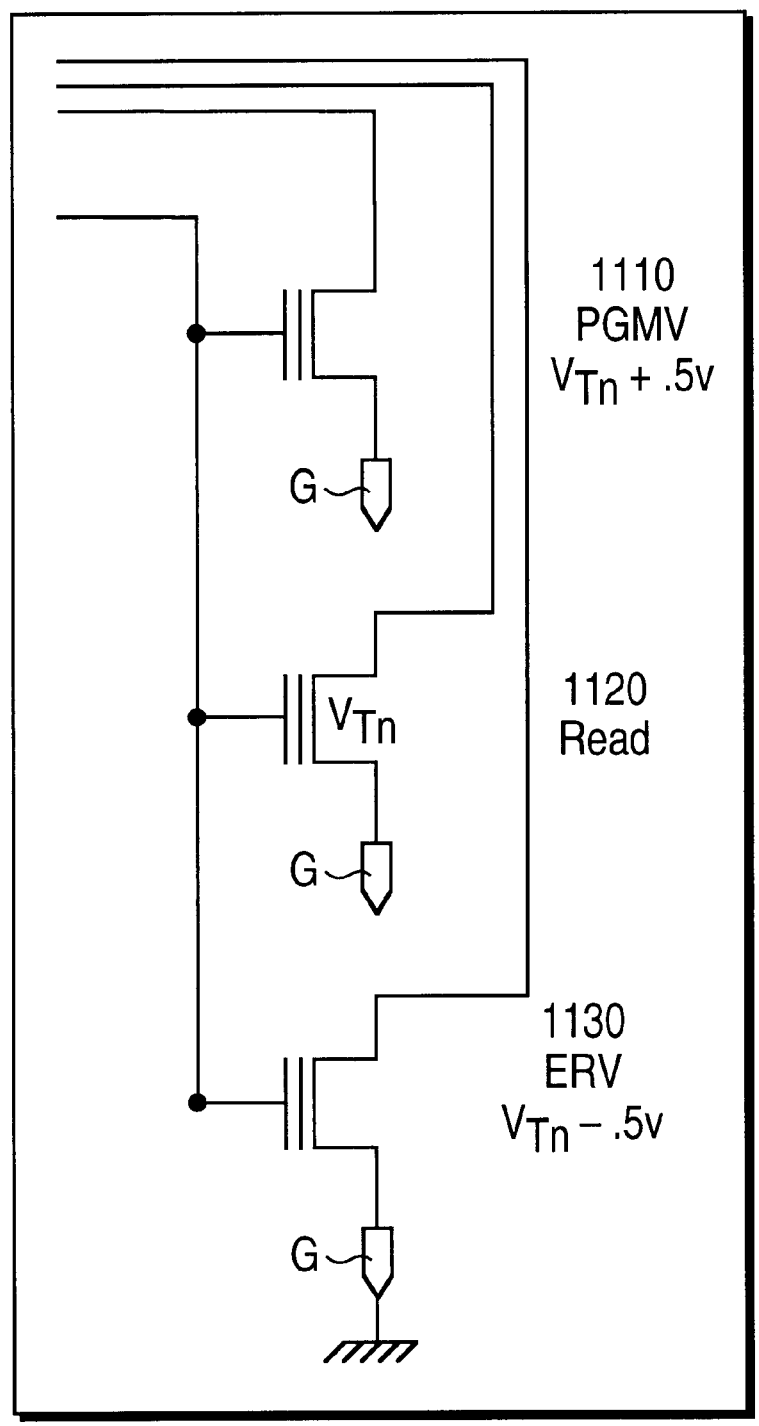
FIG. 11 illustrates plural reference cells programmed to values needed for flash memory operations.

FIG. 11 illustrates a series of three reference cells 1110, 1120, and 1130 in the reference cell array 530 programmed according to the present invention. The reference cells are programmed around a delta of 0.5 v for array cells having a natural threshold of $V_{Tn}$. Thus, a program verify level of $V_{Tn}$+0.5 v (reference cell 1110), a read level of $V_{Tn}$ (reference cell 1120), and an erase verify level of $V_{Tn}$−0.5 (reference cell 1130).

The present invention reuses the embedded capabilities of the flash memory device (or other device), particularly the embedded state machine and possibly some existing flash lines (comparison lines, for example), to automatically program a reference array. Program, program verify, erase, erase verify, and read levels are programmed into the reference array cells (other program levels and plural instances of any existing program levels may also be programmed).

The present invention adds enough circuitry to the state machine so that instead of acting on an array, the functionality of the embedded state machine acts on the reference array to program or erase it instead of an array cell (see reference programming lines 550). Although the present invention utilizes the MOS saturation equation and a comparison of $V_{GS}$ and currents of an array cell and the reference cells (the $_{GS}$ method), other methods for determining whether or not the reference cell has been programmed appropriately are clearly possible.

Figure 12:
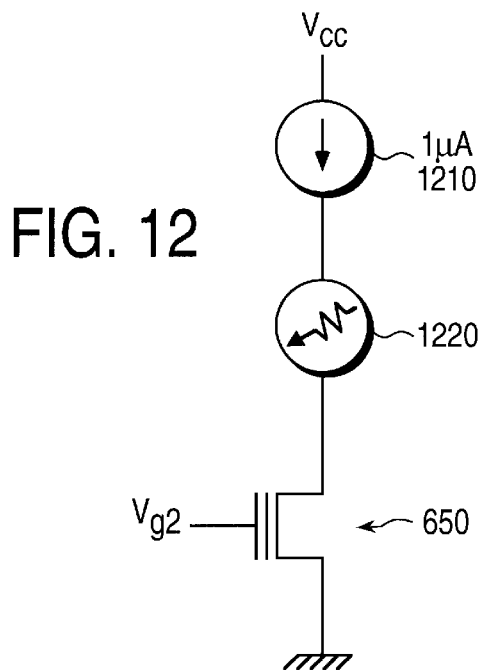
FIG. 12 illustrates one possible alternative device for determining a $V_T$ level of a reference cell according to the present invention.
Figure 12A:
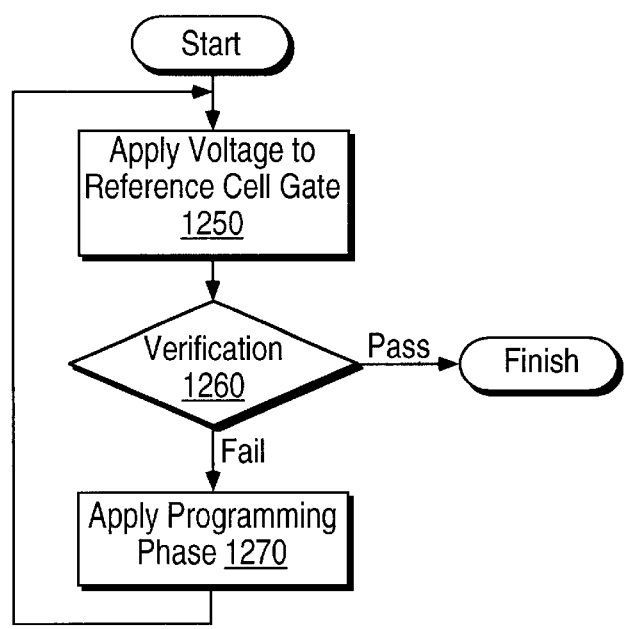
FIG. 12A is a flow chart illustrating a process for programming a reference cell.

FIG. 12 illustrates a device configuration for verifying a $V_T$ level of a reference cell, and FIG. 12A is a flow chart illustrating a process for programming the reference cell (program and program verify of the reference cell). As shown in FIG. 12, a drain of reference cell 650 is connected in series to a current source 1210 (one microamp in this example) and a detector 1220.

As illustrated in the flow chart of FIG. 12, the process is generally embodied in the steps of applying a voltage to the reference cell gate (step 1250), verifying the $V_T$ level of the reference cell (step 1260), and applying a programming pulse to the reference cell (step 1270) if the verification step did not pass. Each of steps 1270, 1250, and 1260 are repeated until the $V_T$ level is verified at step 1260.

At a point where detector 1220 shows that current (typically one microamp) is flowing into the drain of reference cell 650, $V_{g2}$ is equivalent to the threshold level of which the reference cell 650 is currently programmed. Thus, the verification (step 1260, for example) may be performed using this or a similar device configuration to determine the programmed state of the reference cell. As with the array cell/reference cell comparison method, accurate voltages are needed to apply to the gate of the cell being programmed to insure accurate identification of the reference cell $V_T$.

Figure 13:
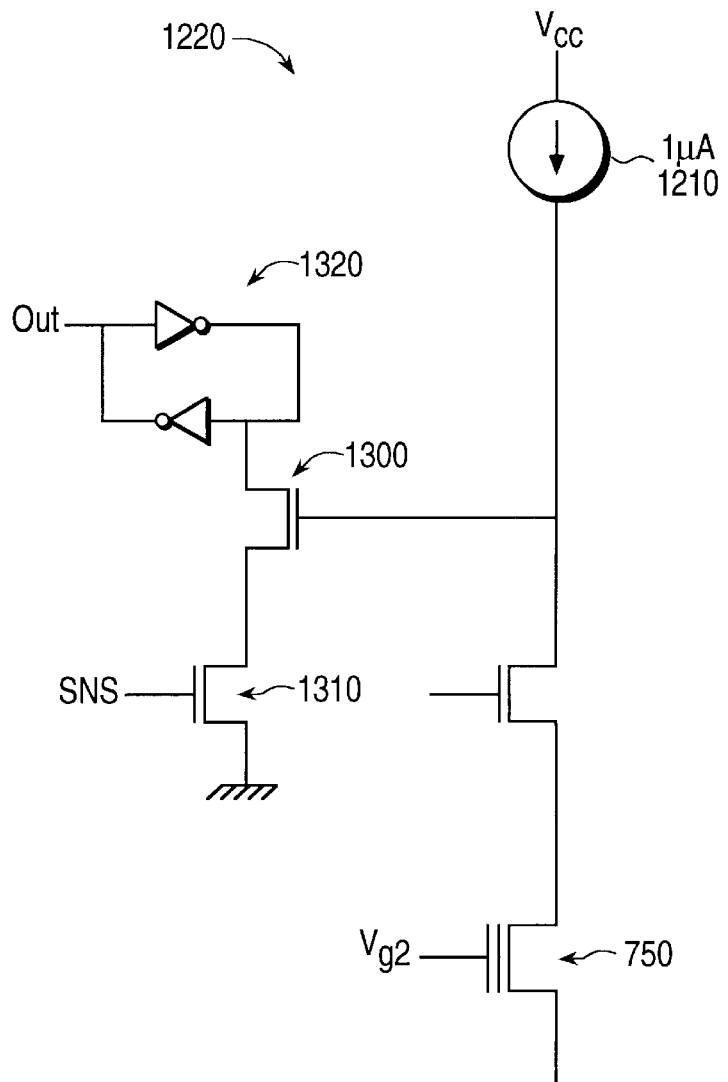
FIG. 13 illustrates a second alternative device for determining a $V_T$ level of a reference cell according to the present invention;.

One possible embodiment of the detector 1220 is illustrated in FIG. 13. A transistor 1300 has its gate connected to the drain of reference cell 650. A drain or source of transistor 1300 is connected to a latch 1320, and the other (drain or source) is connected to one of a drain or source of SNS transistor 1310, and the other (drain or source of SNS transistor 1310) is connected to ground. In operation, when reference cell 650 is not conducting (i.e., current from current source 1210 is not flowing), the gate of transistor 1300 goes up to $V_{CC}$. Then, upon application of an SNS signal to the gate of SNS transistor 1310, the transistor 1300 output to latch 1300 is drawn low because a direct path to ground exists.

Conversely, when the reference cell 650 is conducting, the gate of transistor 1300 is at low voltage, allowing the output of transistor 1300 to latch 1320 to float high. Thus, by applying voltages to the gate of reference cell 650 ($V_{g2}$), the point where reference cell 650 turns on can be determined, thus identifying the $V_T$ of that reference cell.

Since the transistors do not necessarily turn on and off like absolute switches, it is necessary to identify an amount of amperage that identifies the $V_T$ threshold. The present inventors prefer to use one microamp as determining the $V_T$ (i.e., when the transistor is just able to supply one microamp, it is considered that the $V_{GS}$ applied is equivalent to $V_T$), although other current sources may be utilized.

Figure 14:
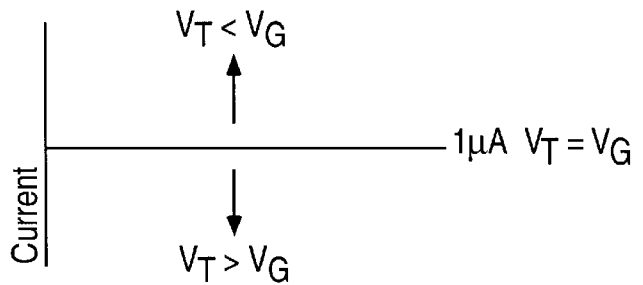
FIG. 14 is a graph illustrating the relative $V_T$ and $V_G$ voltages according to a current flow $V_T$ detection device according to the present invention.

FIG. 14 illustrates a chart that shows the relationship between the gate voltage and the threshold voltage for the amount of amperage flowing through the reference cell at one microamp, $V_T=V_G$. At amperages greater than one microamp $V_T$ is less than $V_G$ and vice versa for amperages lower than one microamp. This analysis is then utilized to determine an amount of programming to be performed on the reference cell 650.

Figure 15:
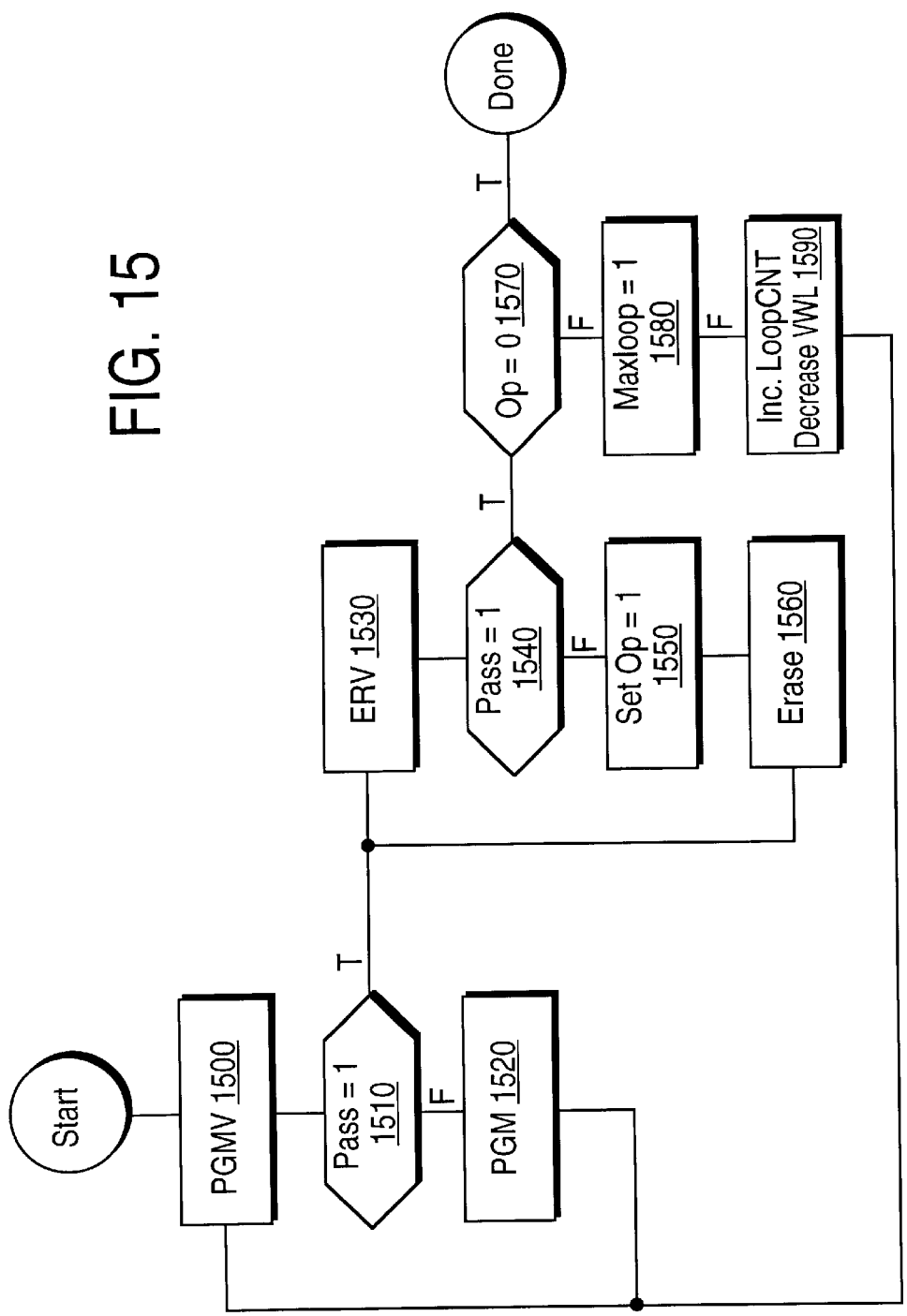
FIG. 15 is a flow chart that describes one possible method to perform programming of flash memory reference cells according to the present invention.

Although it must be understood that many variations are possible, the present inventor has determined a method of programming reference cells that may utilize the above-disclosed methodologies for programming and erasing reference cells. This method is illustrated in FIG. 15, which begins at Step 1500 with a program verify operation (PGMV) that performs a verification operation to determine whether or not the $V_T$ of the reference cell to be programmed is above a program level threshold. At Step 1510, if the program level was not confirmed by the PGMV, Step 1520 is performed, a program operation (PGM). The program operation applies the required voltages to the reference cell to be programmed, thereby raising the $V_T$ of the reference cell in an attempt to bring it to the program state. Any method for programming the reference cell may be utilized, and should be considered within the scope of the present invention. After the program operation is performed, Step 1500, program verify is repeated.

If the program verify operation affirms that a program level of the reference cell is at or above the program level, then step 1530 is performed, an erase verify (ERV). An erase verify operation is generally utilized to determine that a program level of an array cell is at or below a minimum erase threshold. However, in this case, the erase verify operations are utilized to determine that the program state of the array cell is at or below a maximum program threshold. At step 1540, if the reference cell is above the maximum program threshold, an over program bit (op) is set equal to 1 identifying an overprogram state of the reference cell, and at step 1560, an erase operation is performed on the reference cell. After the erase operation, step 1530 is repeated to verify that the reference cell is no longer over programmed.

If the reference cell is no longer over-programmed, or was not overprogrammed at the first occurrence of step 1530

(ERV), then the overprogram bit is interrogated. If the overprogram bit has been set, the entire operation starting with a program verify is repeated if a max loop value (1580) has not been exceeded. In this case, the entire operation begins again, starting with the program verify step 1500. Other variations of program flow in assuring that the reference cells are properly programmed are also possible and the invention should not be limited to this, or any, specific example provided herein.

The present invention has used nomenclature to describe program and erase voltages and read/verify levels of array cells and reference cells. As will be appreciated by those of ordinary skill in the art, these voltages and levels can be set at numerous values and may represent different values within a programmed flash array. For example, the threshold levels may be set at margins different from those described herein and may be any suitable value (0.5, 0.75, or 1, for example). In addition, a programmed state of an array cell in any specific may represent a 1 or 0, depending on how the particular system is set up.

Figure 16:
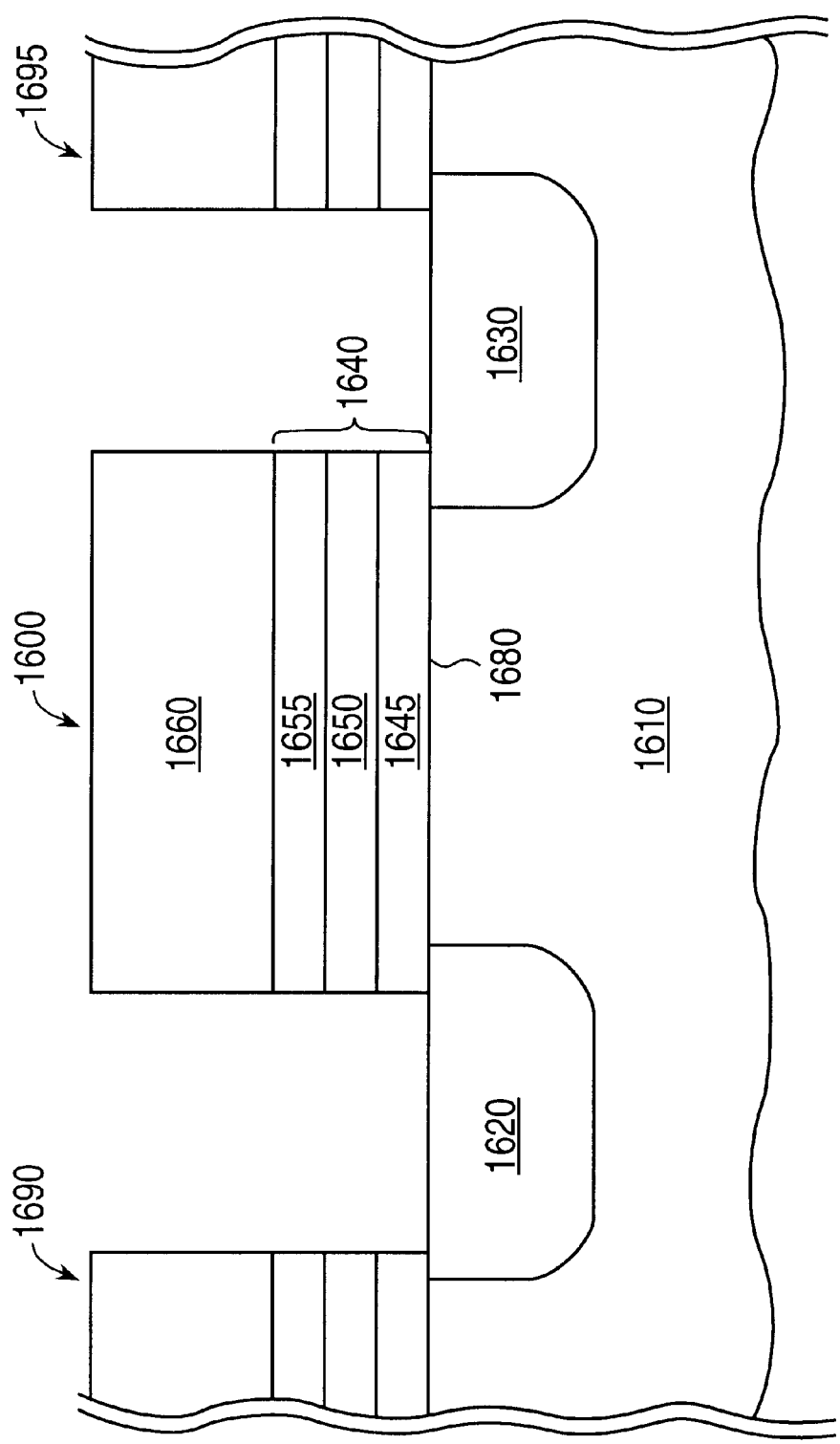
FIG. 16 is an example of an oxide-nitride-oxide (ONO) reference cell that may be programmed according to the present invention.

Furthermore, it should be apparent that the teachings herein, although described in reference to flash cells, and particularly to floating gate cells, are applicable to the programming of any type of flash cell or any electronic device having reference cells that need to be programmed to appropriate voltage levels. As one example, FIG. 16 illustrates a reference cell 1600 with an oxide-nitride-oxide (ONO) structure, including a substrate 1610, a source 1620, a drain 1630, an ONO film 1640 (including $1^{st}$ oxide layer 1645, a nitride layer 1650, and a $2^{nd}$ oxide layer 1655), and a polysilicon gate 1660. FIG. 16 includes other reference cells 1690 and 1695 that may also be programmed according to the processes of the present invention.

In addition, the invention may also be applied to devices having cells with different programming arrangements or processes for programming the cells. For example, the invention may be applied to devices such as those taught in Haddad et al., U.S. Pat. No. 5,077,691, entitled "Flash EEPROM Array with Negative Gate Voltage Erase Operation," which is incorporated herein by reference, in its entirety. Devices using either conventional, or new methods, such as taught in Haddad et al., will benefit from the teachings described herein because the present invention does not solely rely on specific characteristic or details of the programming process of either array cells or reference cells. However, some additional advantages will be apparent when applied to a new design or device (no re-tooling costs in setting up fabrication, for example).

Similarly, the teachings of using an on chip voltage pump (for producing reference cell programming voltages, for example), and the use of an internal state machine (for controlling the reference cell programming voltages, for example), as discussed hereinabove, are also applicable to a wide range of devices including all possible types of flash cells and any other electronic device having programming or precise voltage level requirements (for programming or comparison purposes, for example).

Various aspects of the present invention may be conveniently implemented using a digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits, state machine logic, by interconnecting an appropriate network of component circuits, or other devices, as will be readily apparent to those skilled in the art.

The present invention includes a computer program product which is a storage medium (media) having instructions stored thereon/in which can be used to program a computer (and may be referred to as any of a program, programming, software, firmware, or other similar nomenclature) to perform any of the processes of the present invention. The storage medium can include, but is not limited to, any type of disk including floppy disks, optical discs, DVD, CD-ROMS, microdrive, and magneto-optical disks, ROMs, RAMS, EPROMS, EEPROMS, DRAMs, VRAMS, flash memory devices, magnetic or optical cards, nanosystems (including molecular memory ICs), or any type of media or device suitable for storing instructions and/or data.

Stored on any one of the computer readable medium (media), the present invention includes software for controlling both the hardware of the computer, microprocessor, or other device and for enabling the computer, microprocessor, or other device to interact with a human user or other mechanism utilizing the results of the present invention. Such software may include, but is not limited to, device drivers, operating systems, and user applications. Ultimately, such computer readable media further includes software for performing the present invention, as described above.

Included in the software of the computer, microprocessor, or other devices are software modules for implementing the teachings of the present invention, including, but not limited to, applying voltages and/or supplying currents to reference and array cells reading and comparing voltages and/or currents in any of reference and array cells, programming reference cells, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A memory device comprising:
   internal circuitry configured to program reference cells within the memory device, wherein said internal circuitry utilizes state machine array cell programming circuitry to program said reference cells.

2. A memory device comprising:
   internal circuitry configured to program reference cells within the memory device, wherein said internal circuitry utilizes existing array cell to reference cell comparison circuitry for determining a program level of at least one of said reference cells.

3. A memory device comprising:
   internal circuitry configured to program reference cells within the memory device, wherein said reference array cells are programmed to one of above and below a natural threshold of the array of cells.

4. A memory device comprising:
   internal circuitry configured to program reference cells within the memory device, wherein said reference array cells are nitride layer cells.

5. A memory device comprising:
   internal circuitry configured to program reference cells within the memory device, wherein said internal circuitry comprises:

program circuitry configured to program reference cells in the memory device; and evaluation circuitry configured to determine whether the reference cells are programmed at a predetermined level above or below a natural threshold of array cells in the memory device.

6. The memory device according to claim 5, wherein said evaluation circuitry comprises:

array cell voltage applicators configured to apply evaluation voltages to a selected array cell;

reference cell voltage applicators configured to apply evaluation voltages to a selected reference cell; and comparison circuitry to adjust the evaluation voltages applied to one of the selected reference cell and selected array cell to determine if the reference cell is programmed to said predetermined level.

7. The memory device according to claim 6, wherein said evaluation circuitry comprises:

a detector applied to the reference cell being programmed to determine if the reference cell is programmed to said predetermined level.

8. The memory device according to claim 6, wherein said evaluation voltages are supplied by a voltage source comprising at least one voltage pump internal to the memory device.

9. The memory device according to claim 6, wherein said evaluation voltages are supplied by at least one input line configured to receive voltages from at least one external voltage source.

10. The memory device according to claim 8, further comprising:

a table register storing a set of evaluation voltages according to a table register value;

table register inputs configured to receive signals representing a table value; and a divider configured to divide said voltage source based on a table value represented by a received table value.

11. A memory device comprising:

internal circuitry configured to program reference cells within the memory device, wherein said internal circuitry includes a state machine and at least one array cell for verifying a $V_T$ level of the reference cells.

12. The memory device according to claim 11, wherein said state machine is configured to program said reference cells to within a predetermined delta of a $V_T$ threshold of at least one array cell on the same device.

13. The memory device according to claim 12, wherein said $V_T$ threshold is a natural $V_T$ threshold of said at least one array cell on the same device.

14. A method of programming a reference cell in a device, comprising the step of:

programming a threshold voltage of said reference cell utilizing internal circuitry of the device, wherein said step of programming a threshold level includes the step of applying array cell programming circuitry to said at least one reference cell to program said at least on reference cell.

15. A method of programming a reference cell in a device, comprising the step of:

programming a threshold voltage of said reference cell utilizing internal circuitry of the device, wherein said step of programming a threshold level includes the steps of:

applying array cell to reference cell comparison circuitry to determine a program level of said at least one reference cell.

16. A method of programming a reference cell in a device, comprising the step of:

programming a threshold voltage of said reference cell utilizing internal circuitry of the device, wherein said step of programming a threshold level includes the steps of:

programming said reference cells utilizing control circuitry of said internal circuitry; and evaluating a programmed state of at least one of said reference cells by comparing the programmed state against a predetermined reference level.

17. The method according to claim 16, wherein said step of evaluating includes the steps of:

applying array cell evaluation voltages to a selected array cell;

applying reference cell evaluation voltages to a reference cell to be evaluated; and calculating a programmed state of the reference cell to be evaluated using at least one of said array cell evaluation voltages, said reference cell evaluation voltages, and currents flowing through each of said selected array cell and the reference cell to be evaluated to determine a programmed state of said reference cell.

18. The method according to claim 16, wherein said step of evaluating includes the steps of:

adjusting a gate voltage applied to at least one of the reference cell to be evaluated and said selected array cell until a current flowing in each of said selected array cell and the reference cell to be evaluated are equal; and calculating a programmed state of the reference cell to be evaluated based on a difference in gate voltages between said selected array cell and the reference cell to be evaluated.

19. The method according to claim 16, wherein said step of evaluating includes the steps of:

adjusting a gate voltage applied to at least one of the reference cell to be evaluated and said selected array cell until a ratio of currents flowing in each of said selected array cell and the reference cell to be evaluated comprises a predetermined ration; and calculating a programmed state of the reference cell to be evaluated based on a difference in gate voltages between said selected array cell and the reference cell to be evaluated, and said predetermined ratio.

20. The method according to claim 16, wherein said step of evaluating includes the steps of:

applying a source current to a reference cell to be evaluated; and adjusting a gate voltage the reference cell to be evaluated until one of a stop and start of a predetermined level of current is sourced by the reference cell to be evaluated indicating a programmed state of the reference cell to be evaluated.

21. The method according to claim 17, wherein:

said step of applying array cell evaluation voltages includes at least one step of, applying at least one external voltage source to said selected array cell, dividing at least one of an external voltage and an internal voltage source and applying the divided voltage to said selected array cell, and retrieving a table register value indicating at least one voltage and applying the indicated voltages to said selected array cell; and said step of applying reference cell evaluation voltages to a reference cell to be evaluated includes at least one step of, applying at least one external voltage source to the reference cell to be evaluated, dividing at least one of an external voltage and an internal voltage source and applying the divided voltage to the reference cell to be evaluated, and retrieving a table register value indicating at least one voltage and applying the indicated voltages to the reference cell to be evaluated.

22. A method of programming a reference cell in a device, comprising the step of:

programming a threshold voltage of said reference cell utilizing internal circuitry of the device, wherein said step of programming, comprises the steps of:

applying a $V_T$ voltage from an internal voltage pump to said reference cell;

comparing a current produced by said reference cell to a selected array cell in said device; and adjusting a $V_T$ threshold of said reference cell if the current of the reference cell does not match the current of the selected array cell.

23. The method according to claim 22, wherein said step of adjusting, comprises the steps of:

applying a programming pulse to alter the $V_T$ threshold of said reference cell;

re-comparing the currents produced by said reference cell and the selected array cell; and repeating said steps of applying and re-comparing, until the currents match.

24. The method according to claim 23, wherein said step of applying a programming pulse comprises applying a programming pulse generated by at least one voltage produced by an internal voltage pump of the device.

25. A method of programming a reference cell in a device comprising the steps of:

programming a threshold voltage of said reference cell utilizing internal circuitry of the device;

verifying the programmed threshold of said reference cell; and repeating said steps of programming and verifying until one of a max number of programming attempts has occurred and a predetermined threshold voltage is attained in said reference cell.

26. A method of programming a reference cell in a device, comprising the step of:

programming a threshold voltage of said reference cell utilizing internal circuitry of the device, wherein said step of programming a threshold voltage comprises the steps of, determining if said threshold voltage has at least attained a predetermined program level via a program verify operation;

if said threshold voltage has not attained said predetermined programmed level, then performing the step of, programming the reference cell; and repeating said steps of determining and programming until at least one of a max number of program attempts occurs and said predetermined program level is attained in said reference cell.

27. The method according to claim 26, further comprising the step of:

verifying the programmed threshold of said reference cell.

28. A method of programming a reference cell in a device comprising the steps of:

programming a threshold voltage of said reference cell utilizing internal circuitry of the device;

verifying the programmed threshold of said reference cell; and repeating said steps of programming and verifying until one of a max number of programming attempts has occurred and a predetermined threshold voltage is attained in said reference cell, wherein said step of verifying comprises the steps of:

determining if said threshold voltage has not been over programmed; and if said threshold voltage has been over-programmed, then performing the step of, erasing said reference cell to remove the over-programmed threshold voltage.

29. A method of programming a reference cell in a device comprising the steps of:

programming a threshold voltage of said reference cell utilizing internal circuitry of the device, wherein said step of programming a threshold voltage comprises the steps of:

determining if said threshold voltage has at least attained a predetermined program level via a program verify operation;

if said threshold voltage has not attained said predetermined programmed level, then performing the steps of programming the reference cell; and repeating said steps of determining and programming until at least one of a max number of program attempts occurs and said predetermined program level is attained in said reference cell; and verifying the programmed threshold of said reference cell, wherein said step of verifying comprise the steps of:

determining if said threshold voltage has not been over programmed; and if said threshold voltage has been over programmed, then performing the step of, erasing said reference cell to remove the over programmed threshold voltage.

30. A computer readable media, having instructions stored thereon, wherein, said instructions, when executed by a computer, cause the computer to perform a method that comprises the step of:

programming a threshold voltage of a reference cell in a device utilizing internal circuitry of the device.

31. The computer readable media according to claim 30, wherein said method further comprises the step of:

applying array cell programming circuitry to said reference cell to program said reference cell.

32. The computer readable media according to claim 30, wherein said method further comprises the step of:

applying array cell to reference cell comparison circuitry to determine a program level of said at least one reference cell.

33. The computer readable media according to claim 30, wherein said method further comprises the step of:

programming said reference cells utilizing control circuitry of said internal circuitry; and evaluating a programmed state of at least one of said reference cells by comparing the programmed state against a predetermined reference level.

34. The computer readable media according to claim 30, wherein said method further comprises the step of:

applying a $V_T$ voltage from an internal voltage pump to said reference cell;

comparing a current produced by said reference cell to a selected array cell in said device; and adjusting a $V_T$ threshold of said reference cell if the current of the reference cell does not match the current of the reference cell.

35. The computer readable media according to claim 34, wherein said method further comprises the steps of:

applying a programming pulse to alter the $V_T$ threshold of said reference cell;

re-comparing the currents produced by said reference cell and the selected array cell; and repeating said steps of applying and re-comparing, until the currents match.

36. The computer readable media according to claim 35, wherein said step of applying a programming pulse comprises applying a programming pulse generated by at least one voltage produced by an internal voltage pump of the device.

37. A memory device, comprising:

at least one array cell configured to store data;

at least one reference cell configured to provide a reference for operations performed on said array cells; and means for performing said operations on said array cells utilizing said reference cells; and means for programming said reference cells utilizing internal circuitry of said memory device.

38. The memory device according to claim 37, wherein said memory device is a flash memory device.

39. A memory device comprising:

at least one array cell configured to store data;

at least one reference cell configured to provide a reference for operations performed on said array cells;

means for performing said operations on said array cells utilizing said reference cells; and means for programming said reference cells utilizing internal circuitry of said memory device, wherein said array cells are nitride layer cells.

40. A memory device comprising:

at least one array cell configured to store data;

at least one reference cell configured to provide a reference for operations performed on said array cells;

means for performing said operations on said array cells utilizing said reference cells; and means for programming said reference cells utilizing internal circuitry of said memory device, wherein said means for programming includes:

means for determining a threshold voltage ($V_T$) of a selected reference cell by comparing the selected reference cell to a selected array cell; and means for programming the selected reference cell to a selected $V_T$ based on the determined threshold voltage ($V_T$).

41. A memory device comprising:

at least one array cell configured to store data;

at least one reference cell configured to provide a reference for operations performed on said array cells;

means for performing said operations on said array cells utilizing said reference cells; and means for programming said reference cells utilizing internal circuitry of said memory device, wherein said means for programming comprises:

means for producing high level voltages, internal to said device and controlled by said means for performing, for applying programming pulses to said reference cell arrays.

* * * * *

UNITED STATES PATENT AND TRADEMARK OFFICE
CERTIFICATE OF CORRECTION

PATENT NO.    : 6,418,054 B1
DATED         : July 9, 2002
INVENTOR(S)   : Shane C. Hollmer It is certified that error appears in the above-identified patent and that said Letters Patent is hereby corrected as shown below:

Column 11,
Line 57, after "program said at least", please delete "on" and insert therefor -- one --.
Line 64, please delete "steps" and insert therefor -- step --.

Column 12,
Line 26, please delete "cell" and insert therefor -- cells --.
Line 36, please delete "cell" and insert therefor -- cells --.
Line 39, please delete "ration" and insert therefor -- ratio --.

Column 14,
Line 55, please delete "step" and insert therefor -- steps --.
Line 63, please delete "step" and insert therefor -- steps --.

Column 15,
Line 21, please delete "and".

Signed and Sealed this

Fifteenth Day of October, 2002

Attest:

Attesting Officer

JAMES E. ROGAN
*Director of the United States Patent and Trademark Office*